United States Patent [19]

Nonogaki et al.

[11] 4,191,571
[45] Mar. 4, 1980

[54] METHOD OF PATTERN FORMING IN A PHOTOSENSITIVE COMPOSITION HAVING A RECIPROCITY LAW FAILING PROPERTY

[75] Inventors: Saburo Nonogaki, Tokyo; Takahiro Kohashi; Yoshio Hatano, both of Hachioji, all of Japan

[73] Assignee: Hitachi, Ltd., Tokyo, Japan

[21] Appl. No.: 766,348

[22] Filed: Feb. 7, 1977

Related U.S. Application Data

[63] Continuation-in-part of Ser. No. 571,483, Apr. 24, 1975, abandoned.

[30] Foreign Application Priority Data

Apr. 26, 1974 [JP] Japan ................................. 49/46476
Jun. 28, 1974 [JP] Japan ................................. 49/73328

[51] Int. Cl.² ............................ G03C 5/00; G03C 1/68
[52] U.S. Cl. ................................................. 430/335
[58] Field of Search .................. 96/84 R, 35.1, 115 R, 96/91 N

[56] References Cited

U.S. PATENT DOCUMENTS

| | | | |
|---|---|---|---|
| 3,016,306 | 1/1962 | Mader et al. ........................ | 96/84 R |
| 3,282,699 | 11/1966 | Jones et al. ........................ | 96/84 R |
| 3,695,877 | 10/1972 | Tanada et al. ..................... | 96/115 R |
| 3,695,886 | 10/1972 | Clecak et al. ...................... | 96/115 R |
| 3,702,765 | 11/1972 | Laakso ............................... | 96/115 R |
| 3,887,450 | 6/1975 | Gilano et al. ....................... | 96/35.1 |
| 3,905,819 | 9/1975 | Sakurai et al. ..................... | 96/115 P |
| 3,917,794 | 11/1974 | Akagi et al. ........................ | 96/35.1 |

FOREIGN PATENT DOCUMENTS 752852 12/1953 Fed. Rep. of Germany .
49-102404 9/1974 Japan .

OTHER PUBLICATIONS

Akagi et al., Polymer Engineering and Science, vol. 17, No. 6, 6/77, pp. 353–355.
*Technical Papers*, Regional Technical Conference "Polymers: Principles, Processes and Materials", Oct. 24–26, 1973, Society of Plastic Engineers, Inc.

*Primary Examiner*—Jack P. Brammer
*Attorney, Agent, or Firm*—Birch, Stewart, Kolasch & Birch

[57] ABSTRACT

The present invention relates to a novel light sensitive photoresist composition which is used for the photoengraving process or for production of phosphor screen of color picture tubes. The light sensitive photoresist composition of the present invention comprises a novel water-soluble aromatic azide compound and a photocrosslinkable water-soluble polymer.

11 Claims, 7 Drawing Figures

METHOD OF PATTERN FORMING IN A PHOTOSENSITIVE COMPOSITION HAVING A RECIPROCITY LAW FAILING PROPERTY

This is a continuation in part of our copending application Ser. No. 571,483, filed on Apr. 24, 1975 now abandoned.

BACKGROUND OF THE INVENTION

The present invention relates to a novel light sensitive photoresist composition which is used for the photoengraving process or for production of phosphor screen of color picture tubes.

Light sensitive photoresist compositions which change the solvent solubility under irradiation, are used for precision processing in the photoengraving process or in the production of phosphor screen of color picture tubes.

These light sensitive photoresist compositions are roughly divided in two types, namely the water-insoluble type and the water-soluble type, and these two types are applied properly depending on the intended use.

Water-insoluble light sensitive photoresist compositions require use of organic solvents, and in view of the cost and toxicity, they recently tend to be replaced by water-soluble light sensitive photoresist compositions.

A typical instance of well-known water-soluble light sensitive photoresist compositions is a mixture comprising a water-soluble polymer such as gelatin and polyvinyl alcohol and a dichromate such as ammonium dichromate. This mixture has such a property that it is rendered water-insoluble under irradiation of light. However, this light sensitive photoresist composition undergoes chemical changes at room temperature even under no irradiation, and therefore, it is defective in that the light sensitive characteristics are degraded while it is stored for a long time.

As means for overcoming this defect, it has been proposed to use a diazonium compound or an azide compound instead of the dichromate. Especially, a mixture of a water-soluble polymer and an azide compound is characterized in that it is quite stable in the dark and it can be stored for a long time without degradation of the light sensitive characteristics.

Among such azide compounds that can be used as one component of the light sensitive photoresist composition, a compound represented by the following structural formula I, namely disodium 4,4'-diazidostilbene-2,2'-disulfonate, is especially suitable for use in combination with a water-soluble polymer and is used broadly:

When a mixture of this azide compound and a water-soluble polymer is irradiated with rays of a suitable wave length, the azide compound absorbs the light energy and decomposes, and the decomposition product cross-links polymer molecules to render the polymer water-insoluble. This insolubilization reaction is not caused to occur at room temperature unless the mixture is irradiated.

Figure 1:
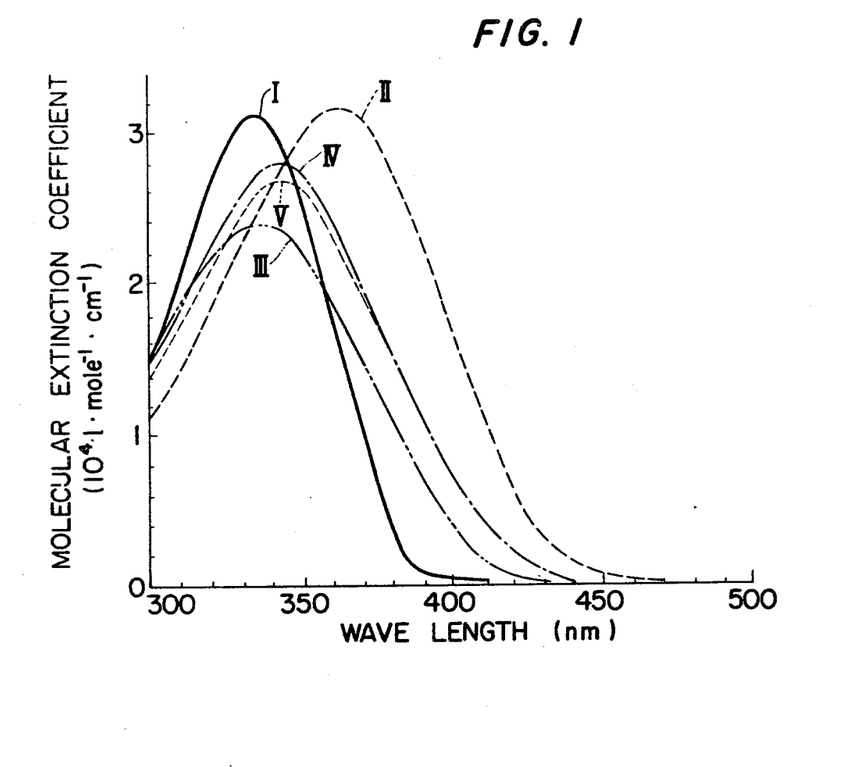
FIG. 1 illustrates the relation between the molecular extinction coefficient and the wave length of light in various water-soluble organic azide compounds, in which Curve I shows the molecular extinction coefficient of the conventional azide compound represented by the above structural formula I and Curves II, III, IV and V show molecular extinction coefficients of azide compounds of this invention represented by corresponding structural formulas II, III, IV and V given hereinafter.

This practical azide compound represented by the structural formula I absorbs intensely rays of a wave length of 300 to 360 nm as shown by Curve I on FIG. 1. Therefore, a light sensitive photoresist composition comprising a mixture of this azide compound and a water-soluble polymer has an especially high sensitivity to rays having a wave length of 300 to 360 nm.

As the light source for light sensitive photoresist compositions, there are generally employed a carbon arc, a tungsten lamp, a super high pressure mercury lamp, a xenon lamp and the like. The light emitted from these light sources include not only rays having a wave length of 300 to 360 nm but also rays having a longer wave length. Accordingly, if these rays having a wave length longer than 360 nm be effectively utilized for the photo-chemical reaction in light sensitive photoresist compositions, it will be possible to increase the sensitivity in the compositions.

As the known azide compound that shows a spectral absorption in a longer wave length region than the azide compound represented by the structural formula I and can be used as a ligbt sensitive component of a light sensitive photoresist composition, there can be mentioned, for example, condensates of an aldehyde such as p-azidobenzaldehyde and p-azidocinnamaldehyde with an aliphatic ketone such as acetone and cyclohexanone. These azide compounds, however, are insoluble in water and therefore, no water-soluble light sensitive photoresist compositions can be obtained by mixing these azide compounds with water-soluble polymers.

SUMMARY OF THE INVENTION

The present invention relates to a water-soluble light sensitive photoresist composition comprising at least one novel water-soluble aromatic azide compound and a photo-crosslinkable water-soluble polymer, said aromatic azide compound being represented by the following general formula:

wherein n is 1 or 0, $R_1$ represents a hydrogen atom or an alkyl group, $R_2$ represents a hydrogen atoms or an alkyl group, $R_1$ and $R_2$ may be linked with each other at their terminals to form a cyclic ketone structure in the molecule, M represents an atom or atomic group capable of being converted to a cation in an aqueous solution, and M' represents an atoms or atomic group capable of being converted to a cation in an aqueous solution.

DESCRIPTION OF THE PREFERRED EMBODIMENTS

The light sensitive component of the light sensitive photoresist composition of this invention is a novel water-soluble aromatic azide compound represented by the following general formula:

wherein n is 1 or 0, $R_1$ represents a hydrogen atom or an alkyl group, $R_2$ represents a hydrogen atom or an alkyl group, $R_1$ and $R_2$ may be linked with each other at their terminals to form a cyclic ketone structure in the molecule, and M represents an atom or atomic group capable of being converted to a cation in an aqueous solution, and M' represents an atom or atomic group capable of being converted to a cation in an aqueous solution. As instances of the atom or atomic group M or M', there can be mentioned, H, alkali metals such as Na and K, ammonium ($NH_4$), alkaline earth metals such as $Mg_{1/2}$, $Ca_{1/2}$ and $Ba_{1/2}$ and metals of the group III of the Periodic Table, such as $Al_{1/3}$. From the practical viewpoint, alkali metals and ammonium are advantageous.

As examples of the azide compound represented by the above general formula, there can be mentioned disodium 4, 4'-diazidodibenzalacetone-2, 2'-disulfonate (structural formula II), 1, 3-bis (4'-azido-2'-sulfobenzylidene) butanone disodium salt (structural formula III), 2, 6-bis (4'-azido-2'-sulfobenzylidene) cyclohexanone disodium salt (structural formula IV), 2, 6-bis (4'-azido-2'-sulfobenzylidene)-4-methylcyclohexanone disodium salt (structural formula V), 2, 5-bis (4'-azido-2'-sulfobenzylidene) cyclopentanone disodium salt (structural formula VI), disodium 4, 4'-diazidodicinnamylideneacetone-2, 2'-disulfonate (structural formula VII), 2, 6-bis (4'-azido-2'-sulfocinnamylidene) cyclohexanone disodium salt (structural formula VIII), 2, 6-bis (4'-azido-2'-sulfocinnamylidene)-4-methylcyclohexanone disodium salt (structural formula IX) and 2, 5-bis (4'-azido-2'-sulfocinnamylidene) cyclopentanone disodium salt (structural formula X).

II

III

IV

V

VI

VII

VIII

IX

X

Each of the foregoing azide compounds is a sodium salt of a sulfonic acid, and each of these salts has a water solubility sufficient from the practical viewpoint. In these sodium sulfonates, the sodium atom may be substituted by other atom or atomic group, for example, hydrogen, potassium, ammonium, magnesium, calcium, barium, aluminum and the like, and these substituted sulfonates can be similarly used as water-soluble light sensitive components. This substitution may be accomplished, for example, by double decomposition in an aqueous solution or ion exchange reaction using a cation exchange resin. In case the sodium atom is substituted by hydrogen or ammonium, a metal-free water-soluble light sensitive photoresist composition can be obtained. Such metal-free light sensitive photoresist compositions are suitable for production of electronic circuits such as semi-conductor devices.

These azide compounds can be used singly, and mixtures of two or more of these azide compounds can also be employed.

These azide compounds can easily be synthesized by condensation of sodium 4-azidobenzaldehyde-2-sulfonate or sodium 4-azidocinnamaldehyde-2-sulfonate with an aliphatic or alicyclic ketone such as acetone or cyclohexanone.

The sodium 4-azidobenzaldehyde-2-sulfonate to be used as the starting compound for this condensation reaction can be synthesized, for example, by oxidizing disodium 4, 4'-diazidostilbene-2, 2'-disulfonate (Structural formula I) with neutral potassium permanganate.

The sodium 4-azidocinnamaldehyde-2-sulfonate that also is used as the starting compound for the condensation reaction can be obtained by condensing this sodium 4-azidobenzaldehyde-2-sulfonate with acetaldehyde in the presence of an alkaline catalyst.

A variety of water-soluble polymers can be used as the water-soluble polymer component constituting, together with the above-mentioned azide compound, the light sensitive photoresist composition of this invention. Especially preferred water-soluble polymers include gelatin, polyacrylamide, poly-N-vinylpyrrolidone, acrylamide-diacetoneacrylamide copolymers, etc. These water-soluble polymers can be used singly, and mixtures of two or more of them can also be used.

In general, the light sensitive photoresist composition of this invention is formed by mixing 70 to 98% by weight, preferably 83 to 96% by weight, of the water-soluble polymer with 2 to 30% by weight, preferably 4 to 17% by weight, of the azide compound.

The so prepared light sensitive photoresist composition is soluble in water. A coating of this light sensitive photoresist composition can be formed on the surface of a solid substrate by coating an aqueous solution of the composition on the surface of the solid substrate and drying the coated surface. When the resulting coating is irradiated with rays emitted from a light source such as a super high pressure mercury lamp or a tungsten lamp and is then washed with water, since irradiated areas of the coating are insolubilized, the coating at these areas is left on the surface of the solid substrate but the coating at the non-irradiated areas is washed away from the surface of the solid substrate because the coating still retains the water solubility at the non-irradiated areas.

This technique can be applied to the photo-engraving process or to the processing in production of phosphor screen of color picture tubes. Further, the light sensitive photoresist composition is characterized in that it has a high sensitivity and an organic solvent need not be used, and therefore, the composition of this invention is very advantageous from the practical viewpoint.

Moreover, the light sensitive photoresist compositions of the present invention have the following characteristics. Namely, it is easy to prepare an aqueous solution of these compositions having the required viscosity as these compositions have a superior water solubility. If bisazide compounds have a hard solvent solubility and are dissolved out little in solvent, the soluble quantities of polymers are also limited since the mixing ratio of bisazide compound with polymer is limited in some specific range. Consequently, an aqueous solution of the light sensitive photoresist composition having a desired viscosity can not be obtained. In general, the light sensitive photoresist compositions having superior water solubility such as that of the present invention have a great advantages from an industrial point of view since these compositions are used as a film which is formed on the surface of a solid substrate by coating an aqueous solution of the composition onto the surface and drying it to form a dried film of the photoresist composition.

Also, the light sensitive photoresist compositions of the present invention have a moderate sensitivity to oxygen. It is often experienced that the photocrosslinking reaction of a photosensitive composition is inhibited by oxygen. If this inhibiting reaction proceeds moderately, the crosslinking reaction does not occur at lower light levels, while, at higher levels, it does occur, overcoming the inhibiting reaction of oxygen. Under these conditions, the photosensitive composition exhibits a practically desirable, high-contrast characteristic, which is usually called reciprocity-law failing property.

If the light sensitive photoresist composition have a too much high sensitivity to oxygen, in other words, if the sensitivity to light is very much lowered by oxygen, the surface layer of the film of it does not photo-crosslink even if the film was highly irradiated by light in air. Consequently, the thickness of the film reduces after development as the uncrosslinked surface layer is removed by development. If the thickness of the original film is too thick, the resolving power of the film becomes insufficient and also, if the thickness of the film is too thin, occurence of such defects as pinholes is observed. In other words, the most preferable film is one which has a sensitivity to oxygen, but does not change its original thickness very much, even before and after development.

The above-mentioned fact will be clarified from a following example. A film (1μ thickness) of a light sensitive photoresist composition consisted of 4.8% by weight of 2, 6-bis (4'-azide-2'-sulfocinnamylidene)-4-methylcyclohexanone disodium salt [Formula IX] and 95.2% by weight of acrylamide-diacetoneacrylamide copolymer (composition ratio of acrylamide (AA) and diacetone-acrylamide (DAA), i.e. AA/DAA = 1.67) was irradiated at the illumination intensity of 11.46 mW/cm$^2$ for 20 seconds by super high pressure mercury lamp and was developed by warm water at 40° C. After that, the thickness of the film was 81% of its original thickness. Namely, in this case, a loss in the original film thickness was 19% and this loss is comparatively small.

Moreover, the light sensitive photoresist compositions having no sensitivity to oxygen do not show a reciprocity-law failing property. On the other hand, the light sensitive photoresist compositions of the present invention which have a moderate sensitivity to oxygen show a suitable reciprocity-law failing property for practical use.

The water-soluble polymer of the present invention are divided into two groups. The first group comprises poly (N-vinylpyrrolidone), copolymers of N-vinylpyrrolidone and acrylamide-diacetoneacrylamide copolymer. A light sensitive photoresist compositions consisting essentially of at least one polymer selected from this first group and at least one of the above-mentioned new bisazide compounds has a reciprocity-law failing property.

The reciprocity-law failing property is the necessary one to the light sensitive photoresist compositions used for producing a black matrix or black stripe type color picture tubes by optical method.

In the case of producing the above-mentioned type of color picture tubes, a film of a light sensitive photoresist composition is exposed to light irradiation through the shadow mask having a desired pattern of beam apertures and the parts of the film corresponding to this pattern are cured. Then, the uncured parts of the film are removed by development. Under this circumstances, it is required to obtain at least smaller size of dot pattern than the size of the apertures of the shadow mask.

In order to achieve this object, a film of a reciprocity-law failing light sensitive photoresist composition has to be used and at the same time, light exposure must be performed under conditions where the value of the Schwarzschild's constant p is such that $0 < p < 0.76$ in the presence of oxygen.

The above-mentioned fact is disclosed in detail in U.S. Pat. No. 3,917,794 and U.S. Pat. Appl. Ser. No. 615,529, now U.S. Pat. No. 4,086,090.

The known water-soluble light sensitive photoresist compositions having a reciprocity-law failing property are somewhat lack of light sensitivity. But a water-soluble light sensitive photoresist composition of the present invention comprising at least one of the new azide compounds and at least one of the above-mentioned water-soluble polymers have a reciprocity-law failing property and high light sensitivity.

Figure 7:
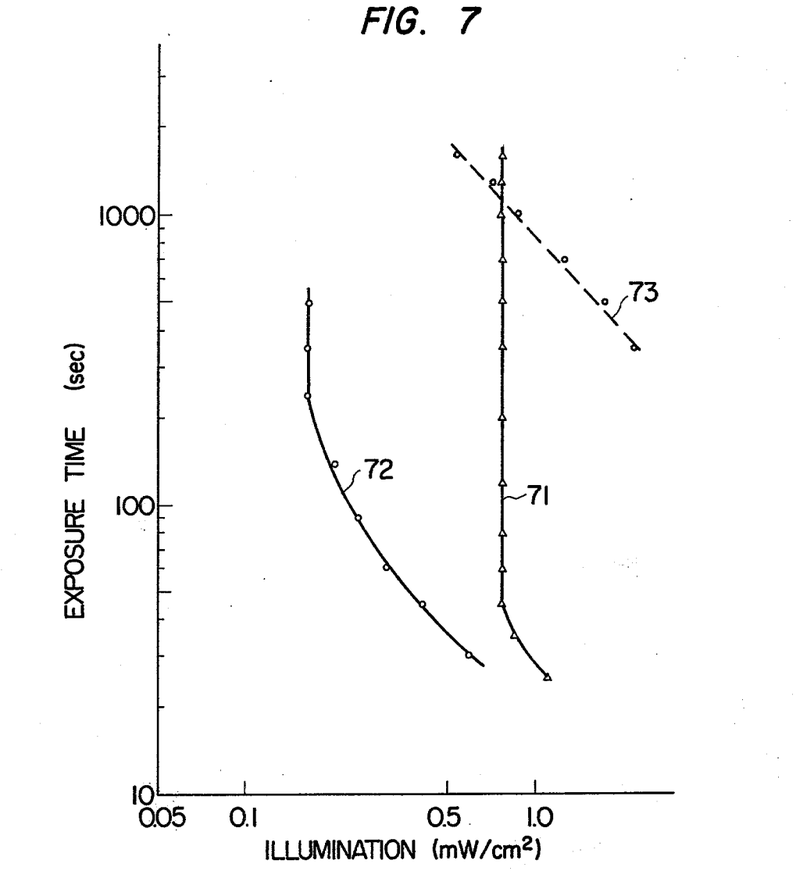
FIG. 7 illustrates the light sensitive characteristics of various light sensitive compounds.

The above-mentioned fact will be explained by using FIG. 7, where the light sensitive properties are indicated as correlations between the minimum exposure time required to cure a film of a light sensitive photoresist and the intensity of the light used. In FIG. 7, the sensitivities of photoresist compositions prepared by adding 2.5% and adding 25% of 2, 6-bis(4'-azide-2'-sulfocinnamylidene)-4-methylcyclohexanone disodium salt [Formula IX] to acrylamide-diacetoneacrylamide copolymer (AA/DAA = 1.67, about 400,000 molecular weight) are shown as the curves 71 and 72 in FIG. 7, respectively. It is clear from this figure that these light sensitive photoresist compositions have a reciprocity-law failing property and high light sensitivity.

On the other hand, the light sensitivity of the light sensitive photoresist composition prepared by adding 2.5% of 2, 6-bix(p-azidocinnamilidene)-4-methylcyclohexanone (This corresponds to the compound lacked sulfonic acid radical from the compound of Formula IX) to cyclized rubber is indicated as the curve 73 is FIG. 7. It is clear from this figure that this composition does not show a reciprocity-law failing property and has low light sensitivity.

The ratio of acrylamide to diacetoneacrylamide in the above-mentioned copolymer (AA/DAA on a mole basis of monomers) lies preferably within the range of from 0.9/1 to 3.0/1, and more preferably from 1.2/1 to 2.0/1. The molecular weight range of this copolymer lies preferably within 10,000 and 5,000,000 and more preferably 200,000 and 5,000,000.

There are N-vinylpyrrolidone-vinylalcohol copolymer, N-vinylpyrrolidone-acrylamide copolymer, etc. as the above-mentioned N-vinylpyrrolidone copolymer. The ratio of N-vinylpyrrolidone and vinylalcohol of the former copolymer is preferably in the range of from 80:20 to 20:80 on a mole basis of monomers. The ratio of vinylpyrrolidone to acrylamide of the latter copolymer is preferably about 50:50 on a mole basis of monomers. The molecular weight range of the above-mentioned vinylpyrrolidone copolymer is preferably in the range of from 10,000 to 5,000,000 and more preferably in the range of from 50,000 to 1,000,000.

The above-mentioned molecular weight was measured by the viscosity method.

In the meanwhile, the second group of the water-soluble polymers comprises the group of the following group such as carboxymethylcellulose, hydroxymethylcellulose, a sodium salt of poly-L-glutamic acid, gelatine, polyacrylamide, polyvinyl methylether, polyvinyl alcohol, polyvinyl acetal, polyethylene oxide, an acrylamide-vinyl alcohol copolymer and a maleic acid-vinyl methylether copolymer.

The composition consisting essentially of at least one copolymer selected from the second group copolymers and at least one of the above-mentioned new water-soluble azide compounds does not show a reciprocity-law failing property. But, it is able to use by adding at least one polymer selected from the second group polymers to at least one polymer selected from the first group polymers. Even if a polymer selected from the second group polymers does not show a reciprocity-law failing property, it is able to improve the other properties such as adhesiveness, etc. of the layer of the light sensitive photoresist composition of the present invention. In this case, the added amount of a polymer selected from the second group polymers is more than 1% by weight based on the total composition and moreover, is, preferably, nearly the same or lesser amount of a polymer selected from the first group polymers. If the amount of a polymer selected from the second group polymers exceeds by a suitable amount, the reciprocity-law failing property of the light sensitive photoresist compositions deteriorate.

Moreover, it is able to add adhesion promoter to the light sensitive photoresist compositions. It is able to use at least one selected from the water-soluble alkoxysilanes included vinyl-tris ($\beta$-methoxyethoxy) silane, N-$\beta$(aminoethyl)-aminopropylmethyl-dimethoxysilane and N-$\beta$(aminoethyl)-$\gamma$-aminopropyl-trimethoxysilane as this adhesion promotor. A preferred amount of the adhesion promoter is in the range of 0.05% to 1.00% by weight based on the polymer. These techniques are described in U.S. Pat. No. 3,917,794 and U.S. Pat. Appl. Ser. No. 615,529 (filed on Sept. 22, 1975) and now U.S. Pat. No. 4,086,090.

Also, it is able to add at least one material selected from the group consisting of surface active agents and ethylene glycol. The purpose of adding these materials is to improve the film uniformity. There are polyoxyethylenealkylether, polyoxyethylenealkylphenolether, sorbitan fatty acid ester, polyoxyethylene sorbitan fatty acid ester, polyoxyethylene acyl ester and fatty acid monoglyceride surface active agents. A preferred amount of the surface active agent is in the range of 1% to 10% by weight based on the polymer.

Ethylene glycol is almost vaporized from the photosensitive photoresist layer finally formed. These techniques are also described in U.S. Pat. Appl. Ser. No. 615,529.

This invention will now be illustrated in detail by reference to the following Examples that by no means limit the scope of this invention. In Examples 1 to 8 and 13 to 16, the process for the synthesis of azide compounds to be used as the light sensitive component of the light sensitive photoresist composition of this invention is illustrated, and the process for the preparation of the light sensitive photoresist composition of this invention by using these azide compounds and various water-soluble polymers and the light sensitive characteristics thereof are illustrated in Examples 9 to 11 and 17 to 18.

EXAMPLE 1

In this Example, the process for the synthesis of sodium 4-azidobenzaldehyde-2-sulfonate which is an intermediate for the production of a water-soluble aromatic azide compound to be used as the light sensitive component of the light sensitive photoresist composition is first described, and the process for preparing disodium 4,4'-diazidodibenzalacetone-2,2'-disulfonate represented by the above structural formula II by using the synthesized intermediate is then described.

(1) Synthesis of sodium 4-azidobenzaldehyde-2-sulfonate 11.2 g of disodium 4,4'-diazidostilbene-2,2'disulfonate (containing about 5 molecules of water per molecule) was added to 200 ml of water to form a suspension. Then, about 10 g of massive solid carbon dioxide was added to this suspension, and while the resulting liquid mixture was being agitated, a solution of 4.0 g of potassium permanganate in 100 ml of water was gradually added to the liquid mixture. The resulting blackish brown suspension was subjected to centrifugal separation to obtain a light brown solution and a blackish brown precipitate. 50 g of sodium chloride was dissolved in the light brown solution, and the resulting solution was allowed to stand still overnight. The resulting white crystal was separated from the mother liquor by suction filtering, and was dried in a desiccator by silica gel to obtain 7.7 g of a white crude crystal, which was found to be a mixture of about 10% by weight of sodium chloride and about 90% by weight of the intended compound.

Recrystallization of the so obtained crude crystal from water as a solvent gave light brown plates. As a result of the elementary analysis of this purified crystal, it was found that carbon was 34.1% by weight, hydrogen was 1.5% by weight and nitrogen was 17.2% by weight. These found values were quite in agreement with values calculated from the molecular formula $C_7H_4N_3NaO_4S$, namely 33.7% by weight carbon, 1.6% by weight hydrogen and 16.9% by weight nitrogen.

When the infrared absorption spectrum of the purified crystal was examined, it showed intense and sharp absorptions at wave numbers of 2150 $cm^{-1}$ and 1695 $cm^{-1}$ and it was confirmed by these absorptions that carbonyl and azido groups were present in the product.

As a result of the measurement of the proton nuclear magnetic resonance spectrum, it was found that the purified crystal showed a singlet absorption at 10.7 ppm based on sodium 3-trimethyl-silylpropionate-2,2,3,3-$d_4$ (TSP), and by this absorption it was confirmed that hydrogen of an aldehyde group was present.

From the foregoing analysis results, it was confirmed that the so obtained purified crystal was the intended compound, namely sodium 4-azidobenzaldehyde-2-sulfonate.

(2) Synthesis of disodium 4,4'-diazidobenzalacetone-2,2'-disulfonate 1.0 g of the crude crystal (containing about 10% by weight of sodium chloride) of the intermediate compound, sodium 4-azidobenzaldehyde-2-sulfonate, prepared accordng to the above-mentioned method, was dissolved in 18 ml of water, and 0.15 ml of acetone and 0.1 g of sodium hydroxide were incorporated and dissolved in the solution. The resulting solution was allowed to stand still overnight at room temperature (18° to 24° C.), and a yellow fibrous crystal formed in the solution was separated from the mother liquor by suction filtering and dried in a desiccator by silica gel to obtain 0.8 g of a yellow crystal. Recrystallization of this crystal from water as a solvent gave a yellowish orange silk thread-like crystal. As a result of the elementary analysis of this crystal, it was found that the crystal was the intended compound, namely disodium 4,4'-diazidodibenzalacetone-2,2'-disulfonate (structural formula II), combined with 0.5 molecule of water per molecule of the intended compound.

As is apparent from the foregoing illustration, disodium 4,4'-diazidodibenzalacetone-2,2'-disulfonate can be synthesized from commercially available disodium 4,4'-diazidostilbene-2,2'-disulfonate by combining the above-mentioned procedures (1) and (2). In this case, in the method (1), it is not absolutely necessary to isolate sodium 4-azidobenzaldehyde-2-sulfonate obtained as the intermediate. More specifically, the light brown solution recovered by the centrifugal separation is an aqueous solution of sodium 4-azidobenzaldehyde-2-sulfonate, and hence, this solution can be directly used for the condensation with acetone according to the method (2). This holds good also with respect to other Examples given hereinafter.

EXAMPLE 2

This Example illustrates the synthesis of 1,3-bis (4'-azido-2'-sulfobenzylidene) butanone disodium salt (structural formula III).

1.0 g of a crude crystal (containing about 10% by weight of sodium chloride) of sodium 4-azidobenzaldehyde-2-sulfonate obtained according to the method described in Example 1-(1) was dissolved in 18 ml of water, and 0.15 ml of methylethyl ketone and 0.14 g of sodium hydroxide were incorporated and dissolved in the solution. The resulting solution was allowed to stand still at room temperature (about 20° C.) for 6 days. 5 g of sodium chloride was incorporated and dissolved in the orange solution. The yellow precipitates formed in the solution was separated from the mother liquor by suction filtering and dried in a desiccator by silica gel to obtain 1.1 g of a yellowish orange powder. Recrystallization of this powder from water gave a purified product, which was found, as a result of the elementary analysis, to be the intended compound, 1,3-bis (4'-azido-2'sulfobenzylidene) butanone disodium salt (structural formula III), combined with one molecule of water per molecule of the intended compound.

EXAMPLE 3

This Example illustrates the synthesis of 2,6-bis (4'-azido-2'-sulfobenzylidene) cyclohexanone disodium salt (structural formula IV).

1.0 g of a crude crystal (containing about 10% by weight of sodium chloride) of sodium 4-azidobenzaldehyde-2-sulfonate synthesized according to the method described in Example 1-(1) was dissolved in 18 ml of water, and 0.2 ml of cyclohexanone and 0.09 g of sodium hydroxide were incorporated and dissolved in the solution. The resulting solution was allowed to stand still overnight at room temperature (18° to 24° C.), and the yellow fine crystal formed in the solution was separated from the mother liquor by suction filtering and dried in a desiccator by silica gel to obtain 0.65 g of a yellow crystal. The so obtained crystal was recrystallized from water as a solvent to obtain a purified product, which was found, as a result of the elementary analysis, to be the intended compound, 2,6-bis (4'-azido-2'-sulfobenzylidene) cyclohexanone disodium salt (structural formula IV), combined with 2.5 molecules of water per molecule of the intended compound.

EXAMPLE 4

This Example illustrates the synthesis of 2,6-bis (4'-azido-2'-sulfobenzylidene)-4-methylcyclohexanone disodium salt (structural formula V).

1.0 g of a crude crystal (containing about 10% by weight of sodium chloride) of sodium 4-azidobenzaldehyde-2-sulfonate obtained according to the method described in Example 1-(1) was dissolved in 18 ml of water, and 0.2 ml of 4-methylcyclohexanone and 0.11 g of sodium hydroxide were incorporated and dissolved in the solution. The resulting solution was allowed to stand still overnight at room temperature (18° to 24° C.), and the resulting yellow fine crystal was separated from the mother liquor by suction filtering and dried in a desiccator by silica gel to obtain 0.79 g of a yellow crystal. Recrystallization of this yellow crystal from water as a solvent gave a purified yellow fine crystal, which was found, as a result of the elementary analysis, to be the intended compound, 2,6-bis (4'-azido-2'-sulfobenzylidene)-4-methylcyclohexanone disodium salt (structural formula V), combined with 2.5 molecules of water per molecule of the intended compound.

EXAMPLE 5

This Example illustrates the synthesis of dipotassium 4,4'-diazidobibenzalacetone-2,2'-disulfonate.

0.8 g of disodium 4,4'-diazidodibenzalacetone-2,2'-disulfonate synthesized according to the method described in Example 1 was mixed with 3.0 g of potassium chloride and 50 ml of water, and the mixture was heated at 70° C. in a water bath under agitation and was then naturally cooled. The resulting orange crystal was separated from the mother liquor by suction filtering and dried in a desiccator by silica gel to obtain 0.63 g of a crude crystal of dipotassium 4,4'-diazidodibenzalacetone-2,2'-disulfonate. Recrystallization of this crude crystal from water as a solvent gave 0.24 g of purified orange needles.

EXAMPLE 6

This Example illustrates the synthesis of diammonium 4,4'-diazidodibenzalacetone-2,2'-disulfonate.

1.2 g of disodium 4,4'-diazidodibenzalacetone-2,2'-disulfonate synthesized according to the method described in Example 1 was mixed with 5.0 g of ammonium carbonate and 50 ml of water, and the mixture was heated at 60° C. in a water bath under agitation and was then naturally cooled. An orange crystal of diammonium 4,4'-diazidodibenzalacetone-2,2'-disulfonate formed in the solution was separated from the mother liquor by suction filtering and dried in a desiccator by silica gel to obtain 0.83 g of a crude crystal. Recrystallization of the crude crystal from water as a solvent gave 0.41 g of purified orange fine prisms.

EXAMPLE 7

This Example illustrates the synthesis of 4,4'-diazidodibenzalacetone-2,2'-disulfonic acid.

1.0 g of disodium 4,4'-diazidodibenzalacetone-2,2'-disulfonate synthesized according to the method described in Example 1 was mixed with 40 ml of water, and the mixture was heated at 80° C. to form a yellow transparent solution. A warm aqueous solution formed by dissolving under heating 1.0 g of barium chloride dihydrate in 10 ml of water was added to the so obtained yellow transparent solution, and the mixture was agitated and naturally cooled. A yellowish orange barium salt formed in the solution was separated from the mother liquid by suction filtering and dried to obtain 1.3 g of an orange solid. A mixture of 0.2 g of sulfuric acid and 5 ml of water was added to this solid and the mixture was agitated. The resulting yellow slurry was filtered by using a filter paper, and the barium sulfate precipitate left on the filter paper was washed with water. The washing liquid was combined with the filtrate to obtain about 8 ml of an orange solution. This solution was dried by means of a vacuum drier to obtain 0.4 g of a blackish brown solid of 4,4'-diazidodibenzalacetone-2,2'-disulfonic acid.

With respect to each of the water-soluble organic azide compounds synthesized in the foregoing Examples 1 to 7, the light absorption spectrum was measured.

More specifically, with respect to each of the known organic azide compound of the structural formula I and the organic azide compounds synthesized in Examples 1 to 7, an aqueous solution containing 0.010 g/l or 0.012 g/l of the sample compound was prepared, and its spectral absorption was measured by using a quartz cell having a liquid length of 1 cm. The results of the measurement are collectively shown as the relation between the molecular extinction coefficient and the wave length of light in FIG. 1.

In FIG. 1, Curves I, II, III, IV and V show the relations between the molecular extinction coefficient and the wave length of light in the azide compounds represented by corresponding Roman FIGS. I, II, III, IV and V. The curves of molecular extinction coefficients of the products obtained in Examples 5, 6 and 7 were found to be well in agreement with Curve II of FIG. 1. Accordingly, these curves are not shown in FIG. 1.

As is apparent from comparison of Curves of FIG. 1, the spectral absorption of each of the azide compounds according to this invention expands toward a longer wave length side than that of the known azide compound (structural formula I).

EXAMPLE 8

This Example illustrates the synthesis of Mg, Ca, Ba and Al salts of 4,4'-diazidodibenzalacetone-2,2'-disulfonic acid.

Disodium 4,4'-diazidodibenzalacetone-2,2'-disulfonate synthesized according to the method described in Example 1 was mixed with a metal salt for double decomposition and water, and the mixture was heated under agitation on a water bath and then naturally cooled. A crystal of the intended compound formed in the solution by double decomposition was separated from the mother liquor and dried to obtain the intended Mg, Ca, Ba or Al salt of 4,4'-diazidodibenzalacetone-2,2'-disulfonic acid. Weights of the starting compounds used for the synthesis of these salts and the double decomposition conditions adopted are as shown in Table 1 given below.

Table 1

| Structural Formula of Resulting Azide Compound** | Double Decomposition Conditions | | | | |
|---|---|---|---|---|---|
| | Amounts of Starting Compounds | | | Temperature (°C.) of Aqueous Solution under Agitation | Amount (g) of Formed Crystal |
| | A* (g) | Metal Salt for Double Decomposition (g) | Water (ml) | | |
| II-Mg$^{(a)}$ | 0.74 | magnesium chloride hexahydrate, 5.0 | 100 | 65–70 | 0.58 |
| II-Ca$^{(b)}$ | 0.74 | calcium chloride dihydrate, 5.0 | 100 | 65–70 | 0.67 |
| II-Ba$^{(c)}$ | 0.61 | barium chloride dihydrate, 5.0 | 100 | 65–70 | 0.54 |
| II-Al$^{(d)}$ | 0.66 | aluminum sulfate hexadeca-to octadeca-hydrate, | 100 | 65–70 | 0.44 |

Table 1-continued

| Structural Formula of Resulting Azide Compound** | Double Decomposition Conditions | | | | |
|---|---|---|---|---|---|
| | Amounts of Starting Compounds | | | Temperature (°C.) of Aqueous Solution under Agitation | Amount (g) of Formed Crystal |
| | A* (g) | Metal Salt for Double Decomposition (g) | Water (ml) | | |
| | | 5.0 | | | |

Notes:
*A = disodium 4,4'-diazidobenzalacetone-2,2'-disulfonate
**Structural formulas of salts (a), (b), (c) and (d) are as follows:

Salt(a)

Salt(b)

Salt(c)

Salt(d)

EXAMPLE 9

The process for preparing light sensitive photoresist compositions by using the light sensitive organic azide compounds synthesized according to the methods described in Examples 1 to 7 and various water-soluble polymers and the light sensitivity characteristics of the resulting compositions are illustrated in this Example.

Aqueous solutions of the azide compounds and aqueous solutions of water-soluble polymers were prepared respectively. One kind of an aqueous solution of the azide compound was combined with one kind of an aqueous solution of a water-soluble polymer. Both the solutions were mixed so that the mixing weight ratio of the polymer to the azide compound was 1:0.05, to thereby form an aqueous solution of a light sensitive photoresist composition. This method is described below more concretely.

Seven azide compounds synthesized according to the methods described in Examples 1 to 7 were separately dissolved in water to obtain 7 aqueous solutions containing 0.2% of the azide compound. A 0.2% aqueous solution of commercially available disodium 4,4'-diazidostilbene-2,2'-disulfonate was similarly prepared and used as a control sample.

Aqueous solutions of water-soluble polymers used were prepared as follows:
Aqueous solution of gelatin:

Gelatin (commercially available chemical grade) was added to water and dissolved under heating in water to form a 4% aqueous solution.
Aqueous solution of polyacrylamide:

Sumiflock FN 10H (the tradename of polyacrylamide manufactured by Sumitomo Kagaku) was dissolved in water to form a 1.0% solution, and N-β (aminoethyl) γ-aminopropyl-trimethoxysilane (manufactured and sold under the tradename "Shin-Etsu Silicone KBM 603" by Shinetsu Kagaku) as an adhesion promotor was added to the aqueous solution in an amount of 3% by weight based on the polymer.
Aqueous solution of poly-N-vinylpyrrolidone:

K 90 (the tradename for poly-N-vinylpyrrolidone manufactured by GAF) was dissolved in water to form a 3.7% solution, and an adhesion promotor (manufactured and sold under the tradename "Shin-Etsu Silicone KBM 603" by Shinetsu Kagaku) was added to the aqueous solution in an amount of 3% by weight based on the polymer.
Aqueous solution of mixture of polyacrylamide and poly-N-vinylpyrrolidone:

The above aqueous solution of polyacrylamide was mixed with the above aqueous solution of poly-N-vinylpyrrolidone so that the mixing weight ratio of the two polymers was 1:1.
Aqueous solution of acrylamide-diacetoneacrylamide copolymer:

Acrylamide was mixed with diacetoneacrylamide at a molar ratio of 1.85:1, and copolymerization was conducted in an aqueous solution by using as polymerization catalysts ammonium persulfate and sodium sulfite. The resulting copolymer aqueous solution was diluted with water to obtain a 1.7% aqueous solution. An adhesion promotor (manufactured and sold under the tradename "Shin-Etsu Silicone KBM 603" by Shinetsu Kagaku) was added to the aqueous solution in an amount of 3% by weight based on the copolymer. The viscosity of a 1.6% aqueous solution of this copolymer was 330 centipoises as measured at 24° C. by a rotational viscometer.

One of the so prepared aqueous solutions of the azide compounds was mixed with one of the so prepared aqueous solutions of the water-soluble polymers so that the mixing weight ratio of the polymer to the azide compound was 1:0.05. The so prepared mixed aqueous solution was coated on a glass sheet and dried. By experiments it was found that the resulting coating had such a property that it was insolubilized under light irradiation and when the irradiated coating was washed with warm water, the coating was left on the glass sheet only at irradiated areas.

With respect to each of the so prepared light sensitive photoresist compositions, the sensitivity to insolubilization under light irradiation was tested in the following manner:

The aqueous solution of the light sensitive photoresist composition was flow-coated on a glass sheet and dried by warm air to form a light sensitive photoresist coating film having a thickness of 3 to 5 um. Light differing in the illumination intensity stepwise was applied to the coating film for a prescribed period from the side of the glass sheet through the glass sheet. Then, the glass sheet was washed with warm water and non-insolubilized portions of the coating film were dissolved and washed away by warm water. The insolubilized coating film left on the glass sheet was examined and the minimum light quantity necessary for insolubilization (product of the illumination intensity and the exposure time) was determined. A tungsten lamp of 250 W was used as the light source for irradiation, and the sample was exposed at a point 35 cm apart from the lamp. The illumination intensity of light at this exposure point was 10000 luxes. In order to perform irradiation of light having the illumination intensity changed stepwise, a step tablet of Eastman Kodack having an optical density changed stepwise by 0.06 was used.

Results obtained in the above tests are shown collectively in Table 2. In Table 2, the sensitivity to insolubilization of each light sensitive photoresist composition is expressed in terms of a relative sensitivity (the reciprocal number of the minimum light quantity necessary for insolubilization of the light sensitive photoresist composition which is expressed by using an optional suitable unit). In Table 2, the light sensitivity of 1 unit indicates such a sensitivity that insolubilization occurs when light of 10000 luxes is applied for 2 minutes from a tungsten lamp of 250 W and insolubilization does not occur when the irradiation time is shorter than 2 minutes.

Table 2

Relative Sensitivities of Light Sensitive Photoresist Compositions

| Structural Formula of Azide Compound | Gelatin | Polyacryl-amide | Poly-N-vinyl-pyrrolidone | Mixture of poly-acrylamide and poly-N-vinyl-pyrrolidone | Acrylamide-diacetone-acrylamide copolymer |
|---|---|---|---|---|---|
| I[a] | 1.0 | 4 | 6 | 6 | 8 |
| II[a] | 2.0 | 6 | 14 | 12 | 14 |
| III[a] | 1.0 | 4 | 6 | 7 | 8 |
| IV[a] | 1.3 | 5 | 8 | 9 | 11 |
| V[a] | 1.1 | 5 | 8 | 8 | 10 |
| II-K[b] | 1.7 | 6 | 12 | 12 | 12 |
| II-NH$_4$[c] | 2.0 | 6 | 12 | 14 | 12 |
| II-H[d] | 2.0 | 6 | 12 | 12 | 12 |

Notes:
[a] Same as described in the text of the specification

From the results shown in Table 2, it is apparent that light sensitive photoresist compositions formed by using azide compounds prepared according to the methods described in Examples of this invention have a higher sensitivity than light sensitive photoresist compositions prepared by using the conventional azide compound (structural formula I).

EXAMPLE 10

This Example illustrates that alkaline earth metal and aluminum salts of light sensitive azide compounds of this invention can be effectively used as the light sensitive component of the light sensitive photoresist composition of this invention.

A magnesium, calcium, barium or aluminum salt of 4,4'-diazidobenzalacetone-2,2'-disulfonic acid synthesized according to the method described in Example 8 was added to poly-N-vinylpyrrolidone in an amount of 5% by weight, and a light sensitive photoresist composition was prepared in the same manner as described in Example 9. The light sensitivity of each composition was determined according to the method described in Example 9. Determined light sensitivities expressed by the same unit as in Example 9 are as follows:

Relative light sensitivity of 10: in the case of Mg salt
Relative light sensitivity of 10: in the case of Ca salt
Relative light sensitivity of 10: in the case of Ba salt
Relative light sensitivity of 8: in the case of Al salt From the above results, it will readily be understood that also in the case of light sensitive photoresist compositions comprising these metal salts the light sensitivity is higher than in the light sensitive photoresist composition comprising the conventional azide compound of the structural formula I (relative light sensitivity of 6).

EXAMPLE 11

This Example illustrates influences of the mixing ratio of the light sensitive azide compound of the water-soluble polymer on the light sensitivity in the water-soluble light sensitive photoresist composition of this invention and the conventional light sensitive photoresist composition. More specifically, the light sensitivity characteristics of a composition of this invention comprising disodium 4,4'-diazidodibenzalacetone-2,2'-disulfonate (structural formula II) synthesized according to the method described in Example 1 were compared with those of a composition comprising disodium 4,4'-diazidostilbene-2,2'-disulfonate (structural formula I) while changing the mixing ratio of the light sensitive compound to the water-soluble polymer.

Figure 2:
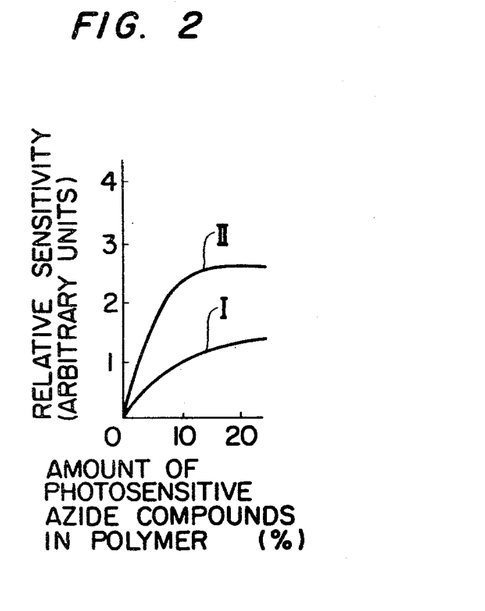
FIGS. 2 and 3 illustrate the relation between the mixing ratio of the light sensitive compound and the water-soluble polymer and the relative light sensitivity in the composition of this invention and the conventional composition, in which Curve I shows the relation in the conventional composition and Curve II shows the relation in the composition of this invention.
Figure 3:
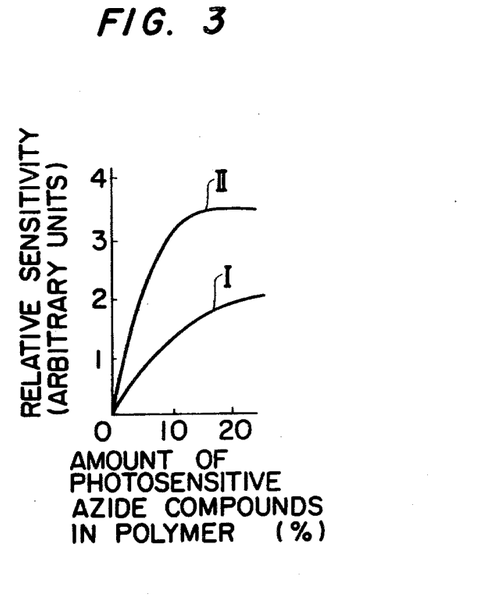

Results obtained when a 0.7:1 mixture of polyacrylamide and poly-N-vinylpyrrolidone was used as the water-soluble polymer are shown in FIG. 2, and results obtained when an acrylamide-diacetoneacrylamide copolymer was used as the water-soluble polymer are shown in FIG. 3. A super high pressure mercury lamp was used as the light source. In other points, the determination of the light sensitivity was conducted in the same manner as in Example 9.

As is apparent from FIGS. 2 and 3, the light sensitivity of the light sensitive photoresist composition of this invention is about 1.7 times as high as that of the conventional light sensitive photoresist composition when compared based on the same mixing ratio of the light sensitive azide compound to the water-soluble polymer. Further, in the composition of this invention the amount incorporated of the azide compound can be reduced to about ½ of the amount of the azide compound required in the conventional composition. It is also seen that a light sensitive composition comprising about 5% by weight of the light sensitive azide compound of this invention has a light sensitivity comparable to the maximum light sensitivity attainable in the composition comprising the conventional azide compound.

In the light sensitive photoresist composition of this invention the sensitivity is saturated when about 15 parts by weight of the azide compound is incorporated per 100 parts by weight of the water-soluble polymer. From the practical viewpoint, it is preferred that the azide compound be incorporated in an amount of 4 to 20 parts by weight per 100 parts by weight of the water-soluble polymer. In other words, the light sensitive photoresist composition of this invention comprises preferably 83 to 96% by weight of the water-soluble polymer and 4 to 17% by weight of the light sensitive azide compound.

EXAMPLE 12

This Example illustrates the synthesis of 2,5-bis(4'-azido-2'-sulfobenzylidene) cyclopentanone disodium salt and results of the measurement of the sensitivity of a light sensitive photoresist composition comprising this disodium salt.

1.47 g of a crude crystal (containing about 10% by weight of sodium chloride) of sodium 4-azidobenzaldehyde-2-sulfonate synthesized according to the method described in Example 1-(1) was dissolved in 34 ml of water, and 0.27 ml of cyclopentanone and 0.22 g of sodium hydroxide were incorporated and dissolved in the solution. The resulting solution was allowed to stand still overnight. A yellowish orange powder formed in the solution was separated from the mother liquor by suction filtering and dried under reduced pressure to obtain 0.84 g of a yellowish orange powder. Recrystallization of the powder from water as a solvent gave a purified product, which was found, from results of the infrared absorption spectrum analysis, the proton nuclear magnetic resonance absorption analysis and the elementary analysis, to be the intended compound, 2,5-bis(4'-azido-2'-sulfobenzylidene) cyclopentanone disodium salt.

Figure 4:
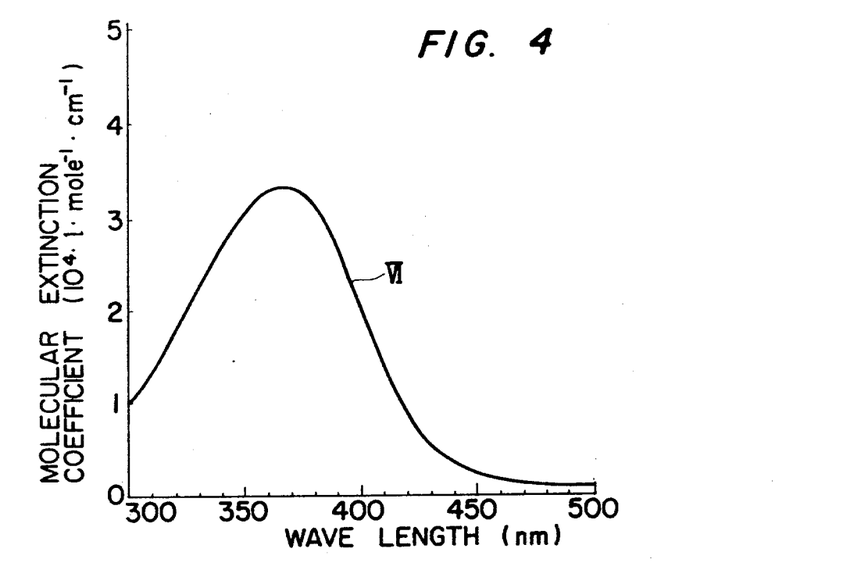
FIGS. 4, 5 and 6 illustrates the relation between the molecular extinction coefficient and the wave length of light in various water-soluble organic azide compounds, in which Curve I shows the molecular extinction coefficient of the conventional azide compound represented by the above structural formula I and Curves VI, VII, VIII, IX and X show molecular extinction coefficients of azide compounds of this invention represented by corresponding structural formulas VI, VII, VIII, IX and X given hereinafter.

Results of the measurement of the light absorption spectrum of the so obtained compound are shown in FIG. 4.

In the same manner as described in Example 9, a light sensitive photoresist composition was prepared by adding 5% by weight of so obtained 2,5-bis(4'-azido-2'-sulfobenzylidene) cyclopentanone disodium salt to poly-N-vinylpyrrolidone. Then, the light sensitivity of the resulting light sensitive photoresist composition was determined in the same manner as described in Example 9. The relative light sensitivity of the composition as expressed by the same unit as in Example 9 was 16, which was much higher than the relative light sensitivity (6) of the composition formed by using the conventional azide compound (structural formula I).

EXAMPLE 13

This Example illustrates the synthesis of sodium 4-azidocinnamaldehyde-2-sulfonate.

11.3 g of sodium 4-azidobenzaldehyde-2-sulfonate synthesized according to the method described in Example 1-(1) and 3.0 g of acetaldehyde were dissolved in 170 ml of water, and a reaction vessel charged with the resulting aqueous solution was immersed in a water bath maintained at 50° C. When the temperature of the reaction mixture was elevated to 50° C., a solution of 0.24 g of sodium hydroxide in 3 ml of water was gradually added to the reaction mixture under agitation. The reaction was conducted in this state for 2 hours. The resulting light dark red reaction mixture was naturally cooled to room temperature, and 43 g of sodium chloride was dissolved in the reaction mixture. The resulting solution was allowed to stand still overnight, and the resulting yellowish orange crystal was separated from the mother liquor by suction filtering and dried under reduced pressure to obtain 7.9 g of a yellowish orange crude crystal which was found to be a mixture composed of about 15% by weight of sodium chloride and about 85% by weight of the intended compound.

Recrystallization of this crude crystal from water as a solvent gave yellowish orange needles. As a result of the elementary analysis of the so obtained purified product, it was found that the purified product comprised 39.3% by weight of carbon, 2.2% by weight of hydrogen and 15.6% by weight of nitrogen. These found values were quite in agreement with calculated values of sodium 4-azidocinnamaldehyde-2-sulfonate as $C_9H_6N_3O_4NaS$, namely 39.3% by weight carbon, 2.2% by weight hydrogen and 15.3% by weight nitrogen.

From the results of the measurement of the infrared absorption spectrum and the measurement of the proton nuclear magnetic resonance absorption using heavy water as a solvent and TSP [sodium 3-trimethylsilylpropionate-2,2,3,3-d$_4$: $(CH_3)_3Si.(CH_2)_2.COONa$] as a reference standard, the purified product was identified as the intended compound.

EXAMPLE 14

This Example illustrates the synthesis of disodium 4,4'-diazidodicinnamylideneacetone-2,2'-disulfonate (structural formula VII).

2.3 g of a crude crystal (containing about 15% by weight of sodium chloride) of sodium 4-azidocinnamaldehyde-2-sulfonate synthesized according to the method described in Example 13 was dissolved in a mixed solvent composed of 60 ml of ethyl alcohol and 8 ml of water, and 0.27 ml of acetone and 0.4 ml of an aqueous solution containing 25% by weight of sodium hydroxide were added to the above solution. The mixture was allowed to stand still overnight at room temperature (18° to 24° C.), and a dark red powder formed in the solution was separated from the mother liquor and dried under reduced pressure to obtain 1.5 g of a dark red powder. Recrystallization of this powder from water as a solvent gave a purified product in the form of a deep red fine powder. From the results of the infrared absorption spectrum analysis, the proton nuclear magnetic resonance absorption analysis and the elementary analysis, the product was found to be the intended compound, disodium 4,4'-diazidodicinnamylideneacetone-2,2'-disulfonate (structural formula VII), combined with 2 molecules of water per molecule of the intended compound.

When procedures of this Example are combined with procedures of Example 13, disodium 4,4'-diazidodicinnamylideneacetone-2,2-disulfonate can be directly synthesized from commercially available disodium 4,4'-diazidostilbene-2,2'-disulfonate. In this case, it is not necessarily to isolate each of sodium 4-azidobenzaldehyde-2-sulfonate and sodium 4-azidocinnamaldehydesulfonate in Example 13. This holds good also in subsequent Examples.

EXAMPLE 15

This Example illustrates the synthesis of 2,6-bis(4'-azido-2'-sulfocinnamylidene) cyclohexanone disodium salt (structural formula VIII).

2.3 g of a crude crystal (containing about 15% by weight of sodium chloride) of sodium 4-azidocinnamaldehyde-2-sulfonate synthesized according to the method described in Example 13 was dissolved in a mixed solvent composed of 60 ml of ethyl alcohol and 8 ml of water, and 0.34 g of cyclohexanone and 0.4 ml of an aqueous solution containing 25% by weight of sodium hydroxide were added to the above solution. The mixture was allowed to stand still at room temperature (18° to 24° C.,) overnight, and a dark red powder formed in the solution was separated from the mother liquor by suction filtering and dried under reduced pressure to obtain 1.6 g of a dark red powder. Recrystallization of this powder from water as a solvent gave a purified product, which was found, from the results of the infrared absorption spectrum analysis, the proton nuclear magnetic resonance spectrum analysis and the elementary analysis, to be the intended compound, 2,6-bis(4'-azido-2'-sulfocinnamylidene) cyclohexanone disodium salt (structural formula VIII), combined with 3 molecules of water per molecule of the intended compound.

EXAMPLE 16

This Example illustrates the synthesis of 2,6-bis(4'-azido-2'-sulfocinnamylidene)-4-methylcyclohexanone disodium salt (structural formula IX).

2.3 g of a crude crystal (containing about 15% by weight of sodium chloride) of sodium 4-azidocinnamaldehyde-2-sulfonate synthesized according to the method described in Example 13 was dissolved in a mixed solvent composed of 60 ml of ethyl alcohol and 8 ml of water, and 0.44 ml of 4-methylcyclohexanone and 0.4 ml of an aqueous solution containing 25% by weight of sodium hydroxide were added to the above solution. The mixture was allowed to stand still at room temperature (18° to 24° C.) overnight. A dark red fine powder formed in the solution was separated from the mother liquor by suction filtering and dried under reduced pressure to obtain 1.5 g of a dark red fine powder. Recrystallization of this powder from water as a solvent gave a purified product, which was found, from the results of the infrared absorption spectrum analysis, the proton nuclear magnetic resonance spectrum analysis and the elementary analysis, to be the intended compound, 2,6-bis(4'-azido-2'-sulfocinnamylidene)-4-methylcyclohexanone disodium salt (structural formula IX), combined with 2 molecules of water per molecule of the intended compound.

EXAMPLE 17

This Example illustrates the synthesis of 2,6-bis(4'-azido-2'-sulfocinnamylidene)-4-methylcyclohexanone diammonium salt.

1.2 g of 2,6-bis(4'-azido-2'-sulfocinnamylidene)-4-methylcyclohexanone disodium salt synthesized according to the method described in Example 16 was mixed with 6 g of ammonium carbonate and 60 ml of water. The mixture was heated at 60° C. in a water bath under agitation and was then naturally cooled. A deep red crystal of 2,6-bis(4'-azido-2'-sulfocinnamylidene)-4-methylcyclohexanone disodium salt formed in the solution was separated from the mother liquor by suction filtering to obtain 0.81 g of a crude crystal. Recrystallization of this crude crystal from water as a solvent gave 0.4 g of a purified product in the form of a deep red fine powder.

EXAMPLE 18

This Example illustrates the synthesis of 2,6-bis(4'-azido-2'-sulfocinnamylidene)-4-methylcyclohexanone.

1.2 g of 2,6-bis(4'-azido-2'-sulfocinnamylidene)-4-methylcyclohexanone disodium salt synthesized according to the method described in Example 16 was mixed with 58 ml of water, and the mixture was heated at 80° C. to obtain a deep red transparent solution. Then, a warm aqueous solution formed by dissolving under heating 1.45 g of barium chloride dihydrate in 15 ml of water was added to the above transparent solution, and the mixture was agitated and then cooled naturally. A deep red barium salt formed in the solution was separated from the mother liquor by suction filtering and dried to obtain 1.3 g of a deep red powder. A mixture of 0.3 g of sulfuric acid and 8 ml of water was added to the so obtained power, and the mixture was agitated to obtain a deep red slurry. The slurry was filtered by using a filter paper, and the barium sulfate precipitate on the filter paper was washed with water. The washing liquid was combined with the filtrate to obtain about 9 ml of a deep red solution. The solution was dried by means of a vacuum drier to obtain 0.42 g of a deep red powder of 2,6-bis(4'-azido-2'-sulfocinnamylidene)-4-methylcyclohexanone.

EXAMPLE 19

This Example illustrates results of the measurement of the light absorption spectra of various water-soluble organic azide compounds.

Each of the known water-soluble organic azide compound (structural formula I) and the organic azide compounds synthesized in Examples 14 to 16 was formed into an aqueous solution containing 0.010 g/l or 0.011 g/l of the azide compound. The spectral absorption of the solution was measured by using a quartz cell having a liquid length of 1 cm. Results are shown in FIG. 5.

Figure 5:
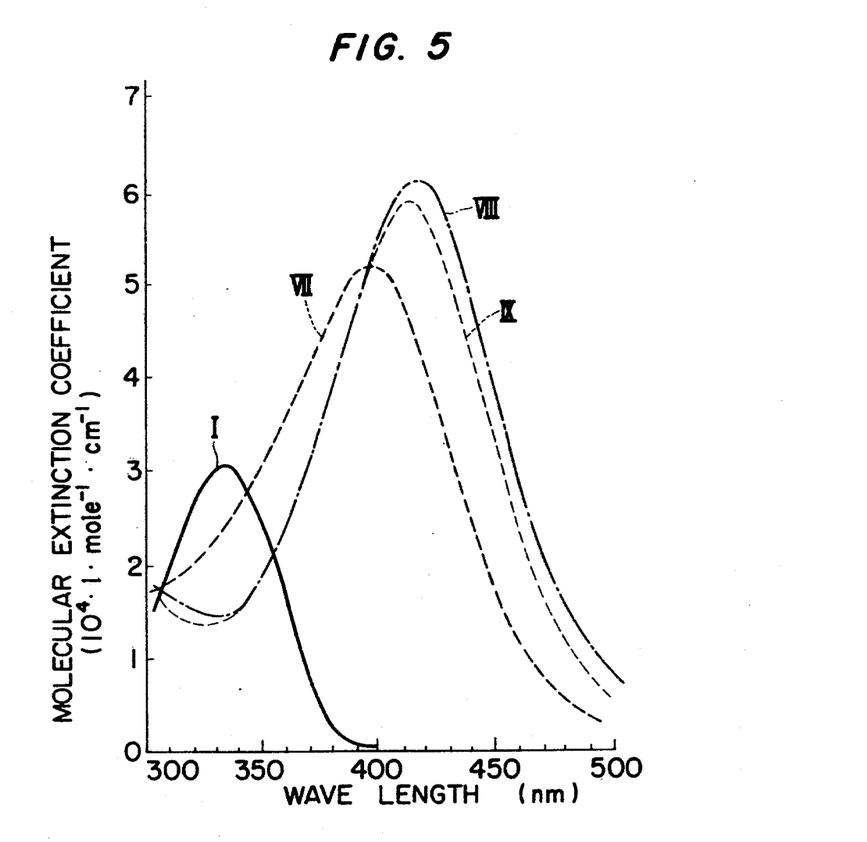

In FIG. 5, Curves I, VII, VIII and IX show the relations between the molecular extinction coefficient and the wave length of light in the azide compounds represented by corresponding structural formulas I, VII, VIII and IX given in the text of the specification.

Curves showing the molecular extinction coefficients of the azide compounds synthesized in Examples 17 and 18 were found to be well in agreement with Curve IX of FIG. 5. Accordingly, these curves are not shown in FIG. 5.

From Curves shown in FIG. 5, it will readily be understood that in each of the azide compounds of this invention (structural formulas VII, VIII and IX) the spectral absorption region expands into a longer wave length side than in the conventional azide compound (structural formula I) and the molecular extinction coefficient of each of these azide compounds of this invention is higher than that of the conventional azide compound.

EXAMPLE 20

This Example illustrates the preparation of light sensitive photoresist compositions.

Light sensitive photoresist compositions were prepared by using the light sensitive organic azide compounds synthesized by the methods illustrated in Examples 14 to 18 and various water-soluble polymers. More specifically, an aqueous solution of an azide compound was mixed with an aqueous solution of a water-soluble polymer so that the mixing weight ratio of the polymer to the azide compound was 1:0.05, to thereby form an aqueous solution of a light sensitive photoresist composition. This method is described below more concretely.

Each of the azide compounds synthesized according to the methods described in Examples 14 to 16 was dissolved in water to form 0.2% aqueous solution. Commercially available disodium 4,4'-diazidostilbene-2,2'-disulfonate was similarly dissolved in water to form a 0.2% aqueous solution, which was used as a control sample.

The same polymer solutions as described in Example 9 were employed for the preparation of light sensitive photoresist compositions, except that as the aqueous solution of a mixture of polyacrylamide and poly-N-vinylpyrrolidone, there was used an aqueous solution formed by mixing a 1.0% aqueous solution of PN-141 C(polyacrylamide manufactured by Kurita Kogyo) and the same aqueous solution of poly-N-vinylpyrrolidone as used in Example 9 so that the mixing weight ratio of the polymers was 1:1.

One of the so prepared azide compound aqueous solutions was mixed with one of the above polymer aqueous solutions so that the mixing weight ratio of the polymer to the azide compound was 1:0.05. From the results of the tests conducted in the same manner as described in Example 9, it was found that each of the so prepared mixture had properties as a light sensitive photoresist composition. These test results are collectively shown in Table 3 in which each value indicates the relative light sensitivity of the resulting light sensitive photoresist composition, which was expressed by the same unit as described in Example 9, Table 2.

Table 3

Relative Sensitivities of Light Sensitive Photoresist Compositions

| Structural Formula of Azide Compound | Water-Soluble Polymer | | | |
|---|---|---|---|---|
| | gelatin | poly-N-vinyl-pyrrolidone | mixture of poly-acrylamide and poly-N-vinyl pyrrolidone | acrylamide-di-acetone-acrylamide copolymer |
| I$^{(a)}$ | 1.0 | 6 | 6 | 8 |
| VII$^{(a)}$ | 1.3 | 12 | 24 | 17 |
| VIII$^{(a)}$ | 1.0 | 18 | 32 | 20 |
| IX$^{(a)}$ | 1.7 | 21 | 42 | 32 |
| IX$^{(b)}$ | 1.7 | 21 | 44 | 32 |
| IX$^{(c)}$ | 1.7 | 21 | 42 | 32 |

Notes:
$^{(a)}$Same as described in the text of the specification

From the results shown in Table 3, it is apparent that light sensitive photoresist compositions prepared by using azide compounds synthesized according to the methods of Examples of this invention have a higher light sensitivity than light sensitive photoresist compositions prepared by using the known conventional azide compound.

EXAMPLE 21

This Example illustrates the synthesis of 2,5-bis(4'-azido-2'-sulfocinnamylidene) cyclopentanone disodium salt and the results of the measurement of the light sensitivity of a light sensitive photoresist composition comprising this azide compound.

1.62 g of a crude crystal (containing about 15% by weight of sodium chloride) of sodium 4-azidocinnamaldehyde-2-sulfonate synthesized according to the method described in Example 13 was dissolved in a mixed solvent composed of 50 ml of ethyl alcohol and 6 ml of water, and 0.27 ml of cyclopentanone and 0.17 ml of an aqueous solution containing 25% by weight of sodium chloride were added to the above solution. The mixture was allowed to stand still at room temperature (18° to 24° C.) overnight. A dark red fine powder formed in the solution was separated from the mother liquor by suction filtering and dried under reduced pressure to obtain 0.99 g of a dark red powder. Recrystallization of this powder from water as a solvent gave a purified product, which was found, from the results of the infrared absorption spectrum analysis, the proton nuclear magnetic resonance spectrum analysis and the elementary analysis, to be the intended compound, 2,5-bis(4'-azido-2'-sulfocinnamylidene) cyclopentanone disodium salt.

Figure 6:
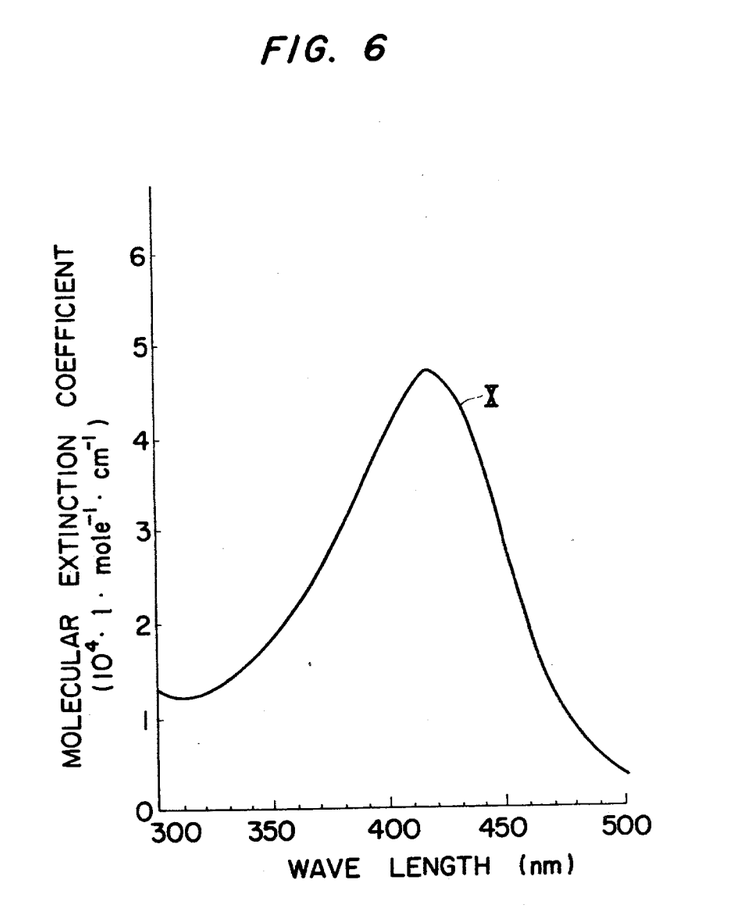

The result of the measurement of the light absorption spectrum of this compound in an aqueous solution is shown in FIG. 6.

In the same manner as described in Example 9, a light sensitive photoresist composition was prepared by adding 5% by weight of so obtained 2,5-bis(4'-azido-2'-sulfocinnamylidene) cyclopentanone disodium salt to poly-N-vinylpyrrolidone, and the light sensitivity of the resulting light sensitive photoresist composition was determined in the same manner as in Example 9. It was found that the relative light sensitivity of this composition expressed by the same unit as described in Example 9 was 18, which was much higher than the relative light sensitivity (6) of the conventional light sensitive photoresist composition prepared by using the conventional light sensitive azide compound (structural formula I).

What is claimed is:

1. A process for forming a pattern which comprises the steps of:
    (a) preparing a photoresist layer consisting essentially of at least one water-soluble polymer selected from the group consisting of poly-N-vinylpyrrolidone, copolymers of N-vinylpyrrolidone and acrylamide-diacetoneacrylamide copolymer and a water-soluble aromatic bisazide compound on a surface of a substrate for the desired pattern, said water-soluble aromatic bisazide compound being at least one compound represented by the following general formula:

wherein n is 1 or 0, $R_1$ represents a hydrogen atom or an alkyl group, $R_2$ represents a hydrogen atom or an alkyl group, $R_1$ and $R_2$ may be linked with each other at their terminals to form a cyclic ketone structure in the molecule, M represents an atom or atomic group capable of being converted to a cation in an aqueous solution, and M' represents an atom or atomic group capable of being converted to a cation in an aqueous solution, said photoresist layer consisting of 70 to 98% by weight of said water-soluble polymer and 2 to 30% by weight of said water-soluble aromatic bisazide compound based on the total amount of photoresist,
    (b) applying light to said photoresist layer by passing the light through a mask having said pattern, in the presence of an oxygen containing gas and with the Schwarzschild's constant p being in the range of greater than 0 and smaller than 0.76, to harden the photoresist layer at a surface area substantially equal to or smaller than that of apertures of said mask through which beams pass, and
    (c) developing the light-applied photoresist layer to form the pattern having a surface area substantially equal to or smaller than that of apertures of said mask through which beams pass.

2. A process as set forth in claim 1, wherein the photoresist layer consists essentially of the water-soluble polymer and the water-soluble aromatic bisazide compound.

3. A process as set forth in claim 1, wherein the water-soluble aromatic bisazide compound is one in which n is zero in the general formula.

4. A process as set forth in claim 1, wherein the water-soluble aromatic bisazide compound in which n is 1 in the general formula.

5. A process as set forth in claim 1, wherein the water-soluble aromatic bisazide compound is one in which $R_1$ and $R_2$ in the general formula are linked to each other at their terminals to form a 5-membered cyclic ketone structure in the molecule.

6. A process as set forth in claim 1, wherein the water-soluble aromatic bisazide compound is one in which $R_1$ and $R_2$ in the general formula are linked to each other at their terminals to form a 6-membered cyclic ketone structure in the molecule.

7. A process as set forth in claim 1, wherein the water-soluble aromatic bisazide compound is disodium 4,4'-diazidodibenzalacetone-2,2'-disulfonate.

8. A process as set forth in claim 1, wherein the water-soluble aromatic bisazide compound is 2, 5-bis(4'-azido-2'-sulfobenzylidene) cyclopentanone disodium salt.

9. A process as set forth in claim 1, wherein the water-soluble aromatic bisazide compound is 2, 6-bis(4'-azido-2'sulfocinnamylidene)-4-methylcyclohexanone disodium salt.

10. A process as set forth in claim 1, wherein the water-soluble aromatic bisazide compound is one in which M in the general formula represents an atom or atomic group selected from hydrogen, sodium, potassium, ammonium, magnesium, calcium, barium and aluminum, and M' in the general formula represents an atom or atomic group selected from hydrogen, sodium, potassium, ammonium, magnesium, calcium, barium and aluminum.

11. A process as set forth in claim 1, wherein at least one second water-soluble polymer selected from the group consisting of carboxymethylcellulose, hydroxymethylcellulose, sodium salt of poly-L-gultamicacid, gelatin, polyacrylamide, polyvinyl methylether, polyvinyl alcohol, polyvinyl acetal, polyethylene oxide, acrylamide-vinyl alcohol copolymer and maleic acid-vinyl methylether copolymer is added in addition to the first water-soluble polymer in the photoresist layer, said second water-soluble polymer being present in an amount of at least 1% by weight based on the total photoresist composition and less than the amount of the first water-soluble polymer, and the total amount of said first and second water-soluble polymer being 70 to 98% by weight based on the total photoresist composition.

* * * * *